(12) United States Patent
Zhang et al.

(10) Patent No.: US 12,364,051 B2
(45) Date of Patent: Jul. 15, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Bike Zhang, Zhejiang (CN); Guangming Liao, Zhejiang (CN); Lin'an Zhang, Zhejiang (CN); Jingsheng Jin, Zhejiang (CN); Xinyu Zhang, Zhejiang (CN)

(73) Assignees: ZHEJIANG JINKO SOLAR CO., LTD., Haining Zhejiang (CN); JINKO SOLAR CO., LTD., Jiangxi (CN)

( * ) Notice: Subject to any disclaimer, the term of this patent is extended or adjusted under 35 U.S.C. 154(b) by 1 day.

(21) Appl. No.: 18/600,467

(22) Filed: Mar. 8, 2024

(65) Prior Publication Data

US 2024/0213381 A1 Jun. 27, 2024

Related U.S. Application Data

(63) Continuation of application No. 17/960,678, filed on Oct. 5, 2022, now Pat. No. 11,973,152.

(30) Foreign Application Priority Data

Aug. 5, 2022 (CN) .......... 202210940296.X
Aug. 5, 2022 (CN) .......... 202222078085.8

(51) Int. Cl.
*H10F 77/20* (2025.01)
*H10F 19/90* (2025.01)

(52) U.S. Cl.
CPC ......... *H10F 77/211* (2025.01); *H10F 19/902* (2025.01); *H10F 77/244* (2025.01)

(58) Field of Classification Search
CPC ..... H01L 31/022441; H01L 31/022425; H01L 31/022466; H01L 31/0504; H01L 31/0682; H10F 77/211; H10F 77/244; H10F 19/902
See application file for complete search history.

(56) References Cited

U.S. PATENT DOCUMENTS 7,468,485 B1 12/2008 Swanson
11,189,739 B1 11/2021 Jin et al.
(Continued)

FOREIGN PATENT DOCUMENTS

CN 102856328 A 1/2013
CN 102986042 3/2013
(Continued)

OTHER PUBLICATIONS

Zhejiang Jinko Solar Co., Ltd., et al., Notice of Allowance, U.S. Appl. No. 17/960,719, May 1, 2024, 19 pgs.
(Continued)

*Primary Examiner* — Mayla Gonzalez Ramos
(74) *Attorney, Agent, or Firm* — USCH Law, PC

(57) ABSTRACT

The solar cell includes: a substrate, a tunneling dielectric layer disposed over the substrate and a doped conductive layer formed over the tunneling dielectric layer. The doped conductive layer includes main body portions and first connecting portions. Each of the main body portions extends in a first direction, and the main body portions are arranged at intervals along a second direction perpendicular to the first direction. At least one first connecting portion in the first connecting portions is located between every two adjacent main body portions and in contact with each of the two adjacent main body portions. The solar cell further includes first electrodes each extending in the first direction. The first electrodes respectively correspond to the main body portions and are arranged at intervals along the second direction, and (Continued)

each first electrode is disposed on and electrically connected to a corresponding one of the main body portions.

20 Claims, 7 Drawing Sheets

(56) References Cited

U.S. PATENT DOCUMENTS

| | | | |
|---|---|---|---|
| 2013/0118571 A1 | 5/2013 | Shim et al. | |
| 2014/0099780 A1 | 4/2014 | Neumayer et al. | |
| 2015/0280027 A1 | 10/2015 | Moors et al. | |
| 2016/0197207 A1 | 7/2016 | Morioka et al. | |
| 2019/0044018 A1* | 2/2019 | Kuniyoshi | H01L 31/0747 |
| 2019/0103499 A1* | 4/2019 | Higashikawa | H01L 31/02013 |
| 2019/0245107 A1 | 8/2019 | Murao et al. | |
| 2019/0031215 A1 | 10/2019 | Lu et al. | |
| 2019/0312156 A1 | 10/2019 | Lu et al. | |
| 2020/0075789 A1 | 3/2020 | Löper et al. | |
| 2020/0343391 A1* | 10/2020 | Choi | H01L 31/02168 |
| 2021/0217907 A1 | 7/2021 | Chen | |
| 2022/0115545 A1 | 4/2022 | Huang et al. | |
| 2022/0158003 A1 | 5/2022 | Jin et al. | |
| 2022/0158009 A1 | 5/2022 | Jin et al. | |

FOREIGN PATENT DOCUMENTS

| | | |
|---|---|---|
| CN | 102986042 A | 3/2013 |
| CN | 204029820 U | 12/2014 |
| CN | 107710419 | 2/2018 |
| CN | 107710419 A | 2/2018 |
| CN | 108110065 A | 6/2018 |
| CN | 108666376 | 10/2018 |
| CN | 108666376 A | 10/2018 |
| CN | 208422924 U | 1/2019 |
| CN | 112466961 A | 3/2021 |
| CN | 112466962 A | 3/2021 |
| CN | 112542521 A | 3/2021 |
| CN | 113471321 A | 10/2021 |
| CN | 114068729 | 2/2022 |
| CN | 114068729 A | 2/2022 |
| CN | 114242803 A | 3/2022 |
| CN | 216488083 U | 5/2022 |
| CN | 114709294 A | 7/2022 |
| DE | 202023101198 U1 | 5/2023 |
| JP | 2007281044 A | 10/2007 |
| JP | 2014216652 A | 11/2014 |
| JP | 2015525961 A | 9/2015 |
| JP | 2015531550 A | 11/2015 |
| JP | 2016103642 A | 6/2016 |
| JP | 2016111357 A | 6/2016 |
| JP | 2021521631 A | 8/2021 |
| JP | 7073566 B1 | 5/2022 |
| JP | 2022081366 A | 5/2022 |
| WO | 2013125036 A1 | 8/2013 |
| WO | 2017002927 A1 | 1/2017 |

OTHER PUBLICATIONS

Zhejiang Jinko Solar Co., Ltd., et al., Final Rejection, U.S. Appl. No. 17/960,719, Nov. 4, 2023, 17 pgs.

Zhejiang Jinko Solar Co., Ltd., et al., Non Final Rejection, U.S. Appl. No. 17/960,719, Nov. 13, 2023, 16 pgs.

Zhejiang Jinko Solar Co., Ltd., et al., Non-Final Rejection, U.S. Appl. No. 17/960,678, Oct. 6, 2023, 14 pgs.

Zhejiang Jinko Solar Co., Ltd., et al., Extended European Search Report, EP 22199434.6, Aug. 14, 2023, 8 pgs.

Zhejiang Jinko Solar Co., Ltd., et al., AU First Office Action, AU 2022241631, Sep. 6, 2023, 7 pgs.

Zhejiang Jinko Solar Co., Ltd., et al., Non-Final Rejection, U.S. Appl. No. 17/960,719, Feb. 7, 2023 14 pgs.

Zhejiang Jinko Solar Co., Ltd., et al., Extended European Search Report, EP 22199686.1, Aug. 18, 2023, 6 pgs.

Zhejiang Jinko Solar Co., Ltd., et al., AU Notice of Acceptance, AU 2022246376, May 26, 2023, 4 pgs.

* cited by examiner

SOLAR CELL AND PHOTOVOLTAIC MODULE

CROSS-REFERENCE TO RELATED APPLICATION

The present application is a continuation of U.S. patent application Ser. No. 17/960,678, filed on Oct. 5, 2022, which claims the benefit of priority under the Paris Convention to Chinese Patent Application No. 202210940296.X filed on Aug. 5, 2022 and Chinese Patent Application No. 202222078085.8 filed on Aug. 5, 2022, each of which is incorporated herein by reference in its entirety.

TECHNICAL FIELD

Embodiments of the present disclosure relate to the field of solar cells, and in particular to a solar cell and a photovoltaic module.

BACKGROUND

A solar cell has desirable photoelectric conversion capability. Generally, a tunneling dielectric layer and a doped conductive layer are prepared on a surface of a substrate to suppress the carrier recombination on the surface of the substrate in the solar cell and enhance the passivation effect on the substrate. The tunneling dielectric layer has better chemical passivation effect, and the doped conductive layer has better field passivation effect. In addition, in order to transport and collect photogenerated carriers generated by the solar cell, electrodes are also prepared on a part of the surface of the substrate.

However, currently, the solar cell has the problem of low photoelectric conversion efficiency.

SUMMARY

A solar cell is provided according to an embodiment of the present disclosure. the solar cell includes a substrate, a tunneling dielectric layer disposed over a first surface of the substrate, and a doped conductive layer formed over the tunneling dielectric layer. The doped conductive layer includes a plurality of main body portions and a plurality of first connecting portions. Each of the plurality of main body portions extends in a first direction, and the plurality of main body portions are arranged at intervals along a second direction perpendicular to the first direction. At least one first connecting portion in the plurality of first connecting portions is located between every two adjacent main body portions in the plurality of main body portions and in contact with each of the two adjacent main body portions. The solar cell further includes a plurality of first electrodes each extending in the first direction. The plurality of first electrodes respectively correspond to the plurality of main body portions and are arranged at intervals along the second direction, and each of the plurality of first electrodes is disposed on and electrically connected to a corresponding one of the plurality of main body portions.

In some embodiments, the plurality of first connecting portions are disposed in a form of an array, the array includes a plurality of columns of first connecting portions disposed at intervals along the second direction, first connecting portions in each column of the plurality of columns of first connecting portions are disposed at intervals along the first direction, there is at least one first electrode in the plurality of first electrodes located between two adjacent columns of first connecting portions.

In some embodiments, a column of the first connecting portions and an adjacent column of the first connecting portions in the plurality of columns of the first connecting portions are disposed in a stagger manner along the first direction.

In some embodiments, a respective first connecting portion of a column of first connecting portions is in one-to-one correspondence to a respective first connecting portion of an adjacent column of first connecting portions, and every two adjacent first connecting portions corresponding to each other are disposed in the spaced manner along the second direction.

In some embodiments, the solar cell further includes a plurality of second electrodes disposed at intervals, wherein each of the plurality of second electrodes extends along the second direction and is electrically connected to the plurality of first electrodes.

In some embodiments, the plurality of second electrodes are spaced apart from the plurality of first connecting portions; or a projection of a part of the plurality of second electrodes on the substrate is overlapped with a projection of a part of the plurality of first connecting portions on the substrate.

In some embodiments, the substrate includes a peripheral area and a central area, the peripheral area is defined as a periphery of a second electrode located at an outermost side in the plurality of second electrodes, the central area is defined as an area of the substrate other than the peripheral area, and a distance between every two adjacent first connecting portions located in the peripheral area in the first direction is smaller than a distance between every two adjacent first connecting portions located in the central area in the first direction.

In some embodiments, in each column of the first connecting portions located in the central area, a distance between every two adjacent first connecting portions in the first direction is constant.

In some embodiments, in each column of the first connecting portions located in the central area, the distance between every two adjacent first connecting portions ranges from 0.01 mm to 20 mm, in each column of the first connecting portions located in the peripheral area, area, a distance between every two adjacent first connecting portions ranges from 0.005 mm to to 18 mm.

In some embodiments, in each column of the first connecting portions, there is at least one first connecting portion located in the peripheral area, and there is one or zero first connecting portion located in the central area.

In some embodiments, the solar cell further includes a plurality of second connecting portions. A respective second connecting portion of the plurality of second connecting portions is located between two adjacent first connecting portions disposed at intervals along the first direction, and is electrically connected to side surfaces of the two adjacent first connecting portions.

In some embodiments, the respective second connecting portion has a width in the second direction less than a distance between two adjacent first electrodes in the second direction.

In some embodiments, a top surface of the plurality of first connecting portions is lower than or level with top surfaces of the plurality of main body portions.

In some embodiments, the top surface of the plurality of first connecting portions has a light trapping structure.

In some embodiments, the light trapping structure is a recessed structure that is recessed towards the tunneling dielectric layer.

In some embodiments, the recessed structure has a cross-sectional shape of triangle or rectangle.

In some embodiments, the doped conductive layer further includes a plurality of third connecting portions, a respective third connecting portion is located between every two adjacent main body portions in the plurality of main body portions and in contact with each of the two adjacent main body portions, a top surface of the plurality of third connecting portions is lower than a top surface of the plurality of main body portions, and the plurality of first connecting portions are located on a part of the top surface of the plurality of third connecting portions.

In some embodiments, the doped conductive layer is made of at least one of doped amorphous silicon, doped polysilicon, or doped microcrystalline silicon.

In some embodiments, the solar cell further includes: a first passivation layer, one part of the first passivation layer covers the first surface of the substrate, and the other part of the first passivation layer covers a surface of the doped conductive layer away from the tunneling dielectric layer.

Correspondingly, a photovoltaic module is further provided according to an embodiment of the present disclosure, the photovoltaic module includes at least one cell string, where the at least one cell string is formed by connecting multiple solar cells, each of the multiple solar cells being a solar cell according to any one above; at least one package layer configured to cover a surface of the at least one cell string; at least one cover plate configured to cover a surface of the at least one package layer away from the at least one cell string.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated.

DETAILED DESCRIPTION

It is known from the background technology that the photoelectric conversion efficiency of a solar cells in the prior art is low.

It is found in the analysis that one of the reasons for the low photoelectric conversion efficiency of the solar cell in the prior art is that, at present, in order to prevent light from being absorbed by a doped conductive layer, the doped conductive layer is generally disposed in a metallized area, and the doped conductive layer in a non-metallized area will be thinned or removed. However, this will lead to the lack of lateral transport channels for carriers in a substrate, that is, the carriers in the substrate are more transported to the area covered by the doped conductive layer, while the area without the doped conductive layer lacks the transport of the carriers, so that the filling factor of the solar cell is greatly reduced, resulting in a problem that the overall power generation efficiency of the solar cell is low.

A solar cell is provided according to the embodiments of the present disclosure, in which multiple doped conductive layers are disposed at intervals, so that in response to incident light irradiating an area between two adjacent doped conductive layers, since the area has no doped conductive layers, the incident light in the area will not be absorbed by the multiple doped conductive layers, thereby reducing the parasitic absorption of the incident light by the multiple doped conductive layers and improving the utilization rate of the incident light by the substrate. In addition, the conductive transport layer is arranged between two adjacent doped conductive layers and in contact with the doped conductive layer, so that the majority carriers in the substrate can be transported into the multiple doped conductive layers through the conductive transport layer, so that the lateral transport of the majority carriers in the substrate is improved, the filling factor of the solar cell is improved, so as to improve the transport capability of the majority carriers in the substrate while improving the utilization rate of incident light, thereby generally improving the photoelectric conversion efficiency of the solar cell.

The embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
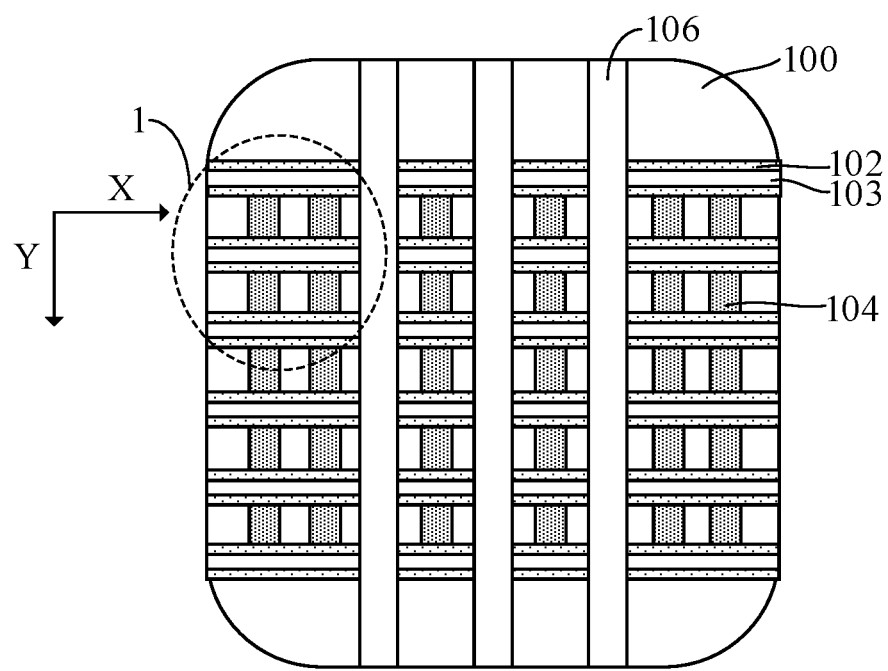
FIG. 1 is a schematic structural view of a top view of a solar cell provided according to an embodiment of the present disclosure.
Figure 2:
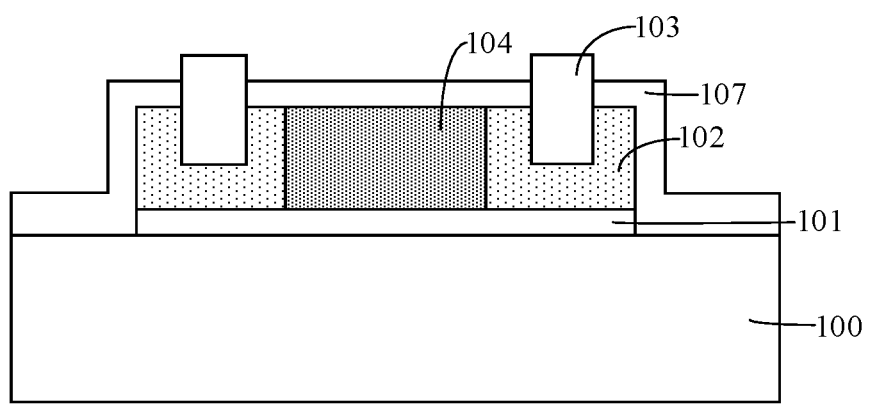
FIG. 2 is a partial enlarged view of 1 shown in FIG. 1.
Figure 3:
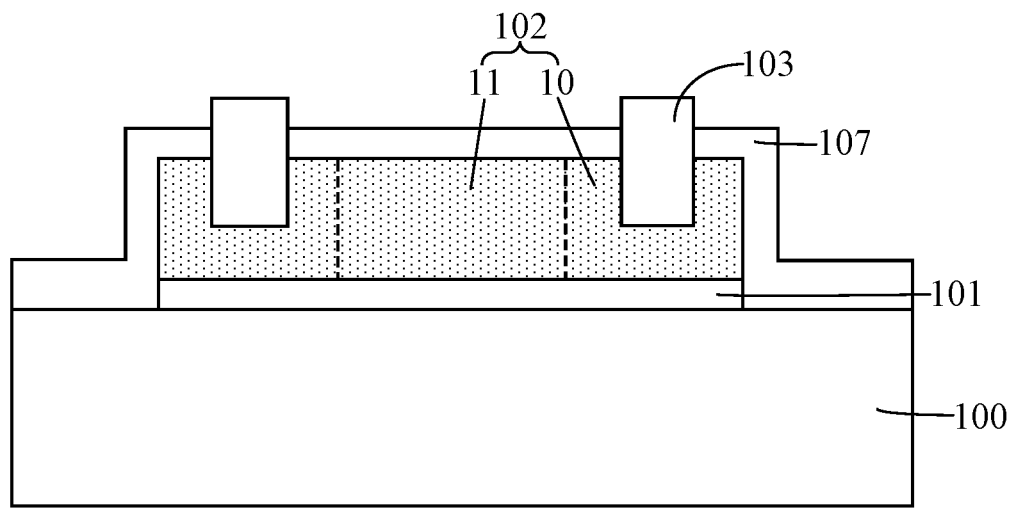
FIG. 3 is another partial enlarged view of 1 shown in FIG. 1.
Figure 4:
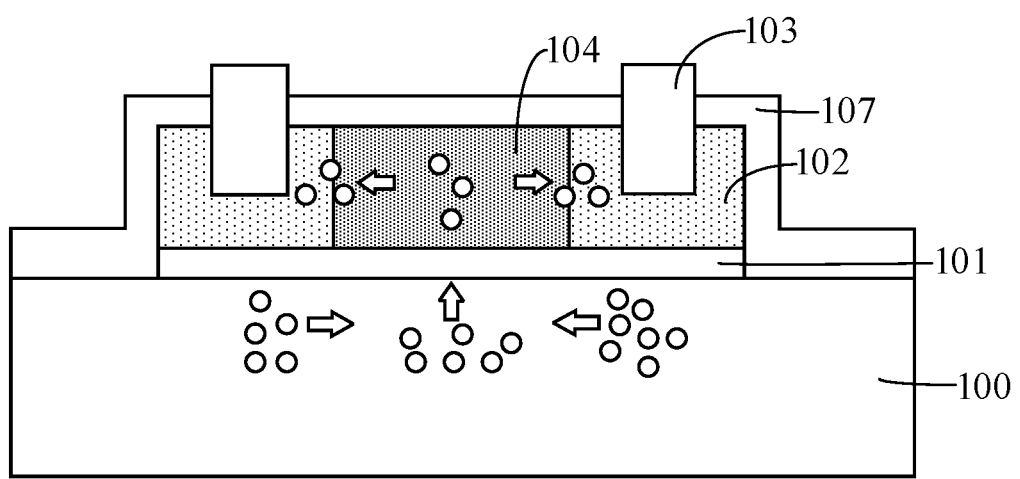
FIG. 4 is a schematic view of carrier transport in the solar cell provided according to an embodiment of the present disclosure.

FIG. 1 is a schematic structural view of a top view of a solar cell provided according to an embodiment of the present disclosure. FIG. 2 is a partial enlarged view of 1 shown in FIG. 1. FIG. 3 is another partial enlarged view of 1 shown in FIG. 1. FIG. 4 is a schematic view of carrier transport in the solar cell provided according to an embodiment of the present disclosure.

Referring to FIG. 1, FIG. 2 and FIG. 4, a solar cell 110 includes: a substrate 100; a tunneling dielectric layer 101 disposed over a first surface of the substrate 100; multiple doped conductive layers 102 arranged at intervals over the tunneling dielectric layer 101; multiple first electrodes 103 each extending in a first direction X, where the multiple first electrodes 103 respectively correspond to the multiple doped conductive layers 102 and are arranged at intervals along a second direction Y perpendicular to the first direction X, and each of the multiple first electrodes 103 is disposed on and electrically connected to a corresponding one of the multiple doped conductive layers 102; at least one conductive transport layer 104 located between every two adjacent doped conductive layers 102 in the multiple doped conductive layers 102, and in contact with a side surface of each of the two adjacent doped conductive layers 102.

The conductive transport layer 104 is arranged between every two adjacent doped conductive layers 102 in the multiple doped conductive layers 102 and in contact with the doped conductive layer 102, so that the majority carriers in the substrate 100 can be transported to the multiple doped conductive layer 102 through the conductive transport layer 104. In this way, the lateral transport of majority carriers in the substrate 100 is improved, the filling factor of the solar cell 110 is improved, the utilization rate of incident light is improved, and the transport capability of the majority carriers in the substrate 100 is improved, thereby improving the overall photoelectric conversion efficiency of solar cell 110. For details, referring to FIG. 4, which is a schematic view of carrier transport in the solar cell provided according to an embodiment of the present disclosure. With the arrangement of the conductive transport layer 104, the carriers in the substrate 100 can move laterally into a lateral transport layer, and is transported into the multiple doped conductive layers 102 through the lateral transport layer 104, thereby increasing the transport capability of carriers in the substrate 100 and increasing the carrier concentration in the multiple doped conductive layers 102.

In other embodiments, each of the doped conductive layers 102 includes multiple main body portions 10 disposed at intervals, and the multiple main body portions 10 are electrically connected to the first electrode 103, that is, the thickness of the doped conductive layer 102 in the metallized area is relatively thicker, so that the multiple main body portions 10 can play a role of reducing metal contact recombination. In response to incident light irradiating the area between the adjacent main body portions 10, the incident light is not absorbed by the multiple main body portions 10, so that the absorption and utilization rate of the incident light by the substrate 100 can be improved.

In addition, each of the doped conductive layers 102 further includes a first connecting portion 11, the first connecting portion 11 is located between every two adjacent main body portions 10, which forms a lateral transport channel for the carriers, so that the majority carriers in the substrate 100 can be transported into the main body portion 10 through the first connecting portion 11, thereby improving the lateral transport capability of the carriers in the substrate 100 in the multiple doped conductive layers 102. In addition, since the main body portion 10 and the first connecting portion 11 are integrally formed, it is beneficial to reduce the loss of carrier transport at the contact interface between the main body portion 10 and the first connecting portion 11 and further improve the carrier transport efficiency.

The substrate 100 is configured to receive incident light and generate photo-generated carriers. In some embodiments, the substrate 100 may be embodied as a silicon substrate, and the silicon substrate may be made of at least one of monocrystalline silicon, polycrystalline silicon, amorphous silicon, or microcrystalline silicon. In other embodiments, the substrate 100 may also be made of at least one of silicon carbide, organic material, or multicomponent compound, where the multicomponent compound includes perovskite, gallium arsenide, cadmium telluride, copper indium selenide, and the like.

In some embodiments, the substrate 100 is doped with N-type or P-type doping ions, where the N-type doping ions may be any one of phosphorus (P) element, bismuth (Bi) element, antimony (Sb) element, arsenic (As) element, or other group V elements, the P-type element may be any one of boron (B) element, aluminum (Al) element, gallium (Ga) element, indium (In) element, or other group III elements. For example, in response to the substrate 100 being P-type substrate 100, the substrate 100 has P-type doping elements. Or, in response to the substrate 100 being N-type substrate 100, the substrate 100 has N-type doping elements, such as anyone of phosphorus element, bismuth element, antimony element, arsenic element.

In some embodiments, the solar cell 110 is a tunnel oxide passivated contact (TOPCON) cell, the substrate 100 further includes a second surface opposite to the first surface, the first surface and the second surface of the substrate 100 are both configured to receive incident light or reflected light. In some embodiments, the first surface may be a backside surface of the substrate 100, and the second surface may be a frontside surface of the substrate 100. In other embodiments, the first surface may also be the frontside surface of the substrate 100, and the second surface may be the backside surface of the substrate 100.

In some embodiments, the first surface of the substrate 100 may be embodied as a non-pyramid textured surface, such as a stacked step topography, so that the tunneling dielectric layer 101 on the first surface of the substrate 100 has high density and uniformity, which causes the tunneling dielectric layer 101 has a desirable passivation effect on the first surface of the substrate 100. The second surface of the substrate 100 may be embodied as a pyramid textured surface, so that the reflectivity of the second surface of the substrate 100 to incident light is lower, resulting in a higher absorption and utilization rate of light.

In some embodiments, the tunneling dielectric layer 101 and the doped conductive layer 102 are configured to form a passivation contact structure on surfaces of the substrate 100, so as to reduce the recombination of carriers in the surfaces of the substrate 100, thereby increasing the open circuit voltage and improving the photoelectric conversion efficiency of the solar cell 110. Specifically, the tunneling dielectric layer 101 can reduce the concentration of defect states on the first surface of the substrate 100, so that the number of recombination centers on the first surface of the substrate 100 is reduced, thereby reducing the recombination rate of carriers.

The doped conductive layer 102 is configured to form a field passivation layer, so that minority carriers escape from the interface, thereby reducing the concentration of minority carriers. Since the carrier recombination rate at the interface of the substrate 100 is lower, the open circuit voltage of the solar cell 110 is reduced, the short-circuit current and the filling factor are relatively large, which improves the photoelectric conversion performance of the solar cell 110. In some embodiments, the doped conductive layer 102 and the substrate 100 have doping elements of the same conductivity type.

In some embodiments, the multiple doped conductive layers 102 extend along the first direction X, and the multiple doped conductive layers 102 are disposed at intervals along the second direction Y, where the second direction Y is perpendicular to the first direction X. In some embodiments, the first electrodes 103 and the doped conductive layers 102 are in a one-to-one correspondence, that is, one first electrode 103 is electrically connected to one doped conductive layer 102. That is to say, the doped conductive layer 102 is only provided in the area corresponding to the first electrode 103, so that the parasitic light absorption effect of the area without the first electrode 103 can be reduced, and the utilization rate of light by the substrate 100 can be improved. In some embodiments, the first electrodes 103 may be made of at least one of silver, aluminum, copper, tin, gold, lead, or nickel.

In other embodiments, the multiple main body portions 10 extend along the first direction X, and the multiple main body portions 10 are disposed at intervals along the second direction Y, where the second direction Y is perpendicular to the first direction X. In some embodiments, the first electrodes 103 and the main body portions 10 are in a one-to-one correspondence, that is, one first electrode 103 is electrically connected to one main body portion 10. That is to say, the main body portion 10 is only provided in the area corresponding to the first electrode 103, so that the parasitic light absorption of incident light done by the doped conductive layer 102 is reduced while improving the contact recombination of the first electrode 103. In some embodiments, the first electrodes 103 may be made of at least one of silver, aluminum, copper, tin, gold, lead, or nickel.

The tunneling dielectric layer 101 and the multiple doped conductive layers 102 are stacked. Specifically, in some embodiments, the tunneling dielectric layer 101 covers the entire first surface of the substrate 100, and the multiple doped conductive layers 102 are disposed at intervals on the top surface of the tunneling dielectric layer 101. In other embodiments, the tunneling dielectric layer 101 is disposed corresponding to the doped conductive layers 102, that is, the tunneling dielectric layer 101 is disposed between the doped conductive layer 102 and the substrate 100, and the tunneling dielectric layer 101 is also located between the conductive transport layer 104 and the substrate 100, so that a part of the tunneling dielectric layer 101 reduces the recombination of carriers on the first surface of the substrate 100, thereby increasing the concentration of carriers transported to the conductive transport layer 104.

In some embodiments, the tunneling dielectric layer 101 may be made of, but is not limited to, aluminum oxide, silicon oxide, silicon nitride, silicon oxynitride, intrinsic amorphous silicon, intrinsic polysilicon, and other dielectric materials with tunneling function. Specifically, the tunneling dielectric layer 101 may be formed of a silicon oxide layer including silicon oxide ($SiO_x$). The silicon oxide has desirable passivation properties, and the carriers can easily tunnel through the silicon oxide layer.

In some embodiments, the conductive transport layer 104 is made of the same material as the doped conductive layer 102. By making the conductive transport layer 104 of the same material as the doped conductive layer 102, on the one hand, types of materials in the entire production process can be reduced to facilitate management. on the other hand, the contact between the conductive transport layer 104 and the doped conductive layer 102 is desirable, so that the transport of carriers at an interface between the doped conductive layer 102 and the conductive transport layer 104 is desirable, thereby reducing transport loss. In addition, the transport rates of carriers in the conductive transport layer 104 and the doped conductive layer 102 can be made similar or the same, thereby improving the transport efficiency of carriers from the conductive transport layer 104 to the doped conductive layer 102. It is worth noting that the same material here means that the conductive transport layer 104 has the same doping ion type and doping ion concentration as those in the doped conductive layer 102.

In other embodiments, the main body portion 10 and the first connecting portion 11 are integrally formed, on the one hand, the types of materials in the whole production process can be reduced, so as to facilitate management. On the other hand, the first connecting portion 11 and the main body portion 10 are made to have the same carrier type and carrier concentration, so that the transport of carriers at an interface between the main body portion 10 and the first connecting portion 11, thereby reducing transport loss. In addition, the transport rate of carriers in the main body portion 10 and the first connecting portion 11 can be made the same, thereby improving the transport efficiency of carriers from the first connecting portion 11 to the main body portion 10.

Specifically, in some embodiments, the doped conductive layer 102 is made of at least one of doped amorphous silicon, doped polysilicon or doped microcrystalline silicon. Correspondingly, the conductive transport layer 104 may also be made of one of doped amorphous silicon, doped polysilicon or doped microcrystalline silicon material.

It can be understood that, in other embodiments, the conductive transport layer 104 may also be made of different material from the doped conductive layer 102, for example, the conductive transport layer 104 may be made of one of doped amorphous silicon, doped polysilicon or doped microcrystalline silicon, the doped conductive layer 102 may be made of another one of doped amorphous silicon, doped polysilicon, or doped microcrystalline silicon.

In some embodiments, in response to the conductive transport layer 104 being made of different material from the doped conductive layer 102, the absorption coefficient of the conductive transport layer 104 to the incident light can be set to be smaller than the absorption coefficient of the incident light of the conductive transport layer 104, so that the absorption capability of the conductive transport layer 104 for incident light can be reduced while improving the lateral transport capability of carriers, thereby improving the utilization rate of the incident light by the solar cell 110.

In some embodiments, since the conductive transport layer 104 is made of the same material as the doped conductive layer 102, the actual process method for preparing the doped conductive layer 102 and the conductive transport layer 104 is as follows.

An initial tunneling dielectric layer 101 and an initial doped conductive layer 102 are formed on the first surface of the substrate 100 by a deposition process, where the initial tunneling dielectric layer 101 covers the entire first surface of the substrate 100, and the initial doped conductive layer 102 covers the entire first surface of the tunneling dielectric layer 101.

A patterning process is performed on the top surface of the initial doped conductive layer 102 to define the shape of the doped conductive layer 102 disposed at intervals and the shape of the conductive transport layer 104.

The patterned initial doped conductive layer 102 is subjected to an etching process to remove a part of the initial doped conductive layer 102 to form the doped conductive layers 102 disposed at intervals and the conductive transport layers 104 located between adjacent doped conductive layers 102.

In some embodiments, a laser process is used to perform laser etching on the initial doped conductive layer 102, so that the etching process is relatively simple, and the patterning process for the initial doped conductive layer 102 may be omitted, which is beneficial to simplify the preparation process.

In some embodiments, in response to the tunneling dielectric layer 101 being arranged to cover the entire first surface of the substrate 100, and the multiple doped conductive layers 102 being arranged on the top surface of the tunneling dielectric layer 101 at intervals, in the etching process, only the initial doped conductive layer 102 is etched, and the initial tunneling dielectric layer 101 is served as the tunneling dielectric layer 101.

In other embodiments, the tunneling dielectric layer 101 is disposed corresponding to the doped conductive layer 102, that is, the tunneling dielectric layer 101 is disposed between the doped conductive layer 102 and the substrate 100, and the tunneling dielectric layer 101 is also located between the conductive transport layer 104 and the substrate 100, the initial tunneling dielectric layer 101 is etched simultaneously during the process of etching the initial doped conductive layer 102 to form the doped conductive layer 102 and the conductive transport layer 104 corresponds to the tunneling dielectric layer 101.

In some embodiments, there are multiple conductive transport layers 104, and the multiple conductive transport layers 104 are disposed along the first direction X at intervals. By disposing multiple conductive transport layers 104 between two adjacent doped conductive layers 102, the majority carriers in the substrate 100 can be transported into the doped conductive layers 102 through the multiple conductive transport layers 104, thereby enhancing the lateral transport capability of majority carriers in the substrate 100. In addition, the multiple conductive transport layers 104 are disposed in a space manner, that is, the multiple conductive transport layers 104 do not cover all areas between two adjacent doped conductive layers 102, but are disposed on a partial area between two adjacent doped conductive layers 102. In this way, in response to the conductive transport layer 104 being made of the same material as the doped conductive layer 102, the overall area of the conductive transport layer 104 will not be excessive, thereby preventing the incident light from being excessively absorbed by the conductive transport layer 104, resulting in a low utilization rate of the incident light by the substrate 100.

In some embodiments, the multiple conductive transport layers 104 are disposed in an array, the array includes multiple columns of conductive transport layers 104 disposed at intervals along the second direction Y, multiple conductive transport layers 104 in each column of the multiple columns of conductive transport layers 104 are disposed at intervals along the first direction X, there is at least one first electrode 103 between two adjacent columns of conductive transport layers 104 along the second direction Y, and the second direction Y is perpendicular to the first direction X. That is, in some embodiments, in response to only one first electrode 103 being arranged between adjacent conductive transport layers 104, there is at least one conductive transport layer 104 between every two adjacent first electrodes 103. In other embodiments, there may also be multiple first electrodes 103 between two adjacent columns of conductive transport layers 104, so that there is at least one conductive transport layer 104 between some of the two adjacent first electrodes 103, and there is no conductive transport layer 104 between other adjacent first electrodes. For example, along the first direction X, there is at least one conductive transport layer 104 between a No. 1 first electrode 103 and a No. 2 first electrode 103, and there is no conductive transport layer 104 between the No. 2 first electrode 103 and a No. 3 first electrode 103. It can be understood that, in response to the conductive transport layer 104 being made of the same material as the doped conductive layer 102, the greater the number of the conductive transport layer 104, the stronger the absorbing capability to incident light while enhancing the lateral capability of carriers. Therefore, connecting relationship between the conductive transport layer 104 and the doped conductive layer 102 can be flexibly set based on the total number of the first electrodes 103 and the demand for the current collecting capability of the first electrodes 103, so as to prevent the incident light from being excessively absorbed by the conductive transport layer 104 while improving the transport capability of carriers.

Referring to FIG. 1, in some embodiments, at least one conductive transport layer 104 is disposed between all adjacent first electrodes 103, which improves the lateral transport capability between adjacent first electrodes 103, thereby improving the current collecting capability of each first electrode 103.

Referring to FIG. 2, in some embodiments, the top surface of the conductive transport layer 104 is lower than or flush with the top surface of the doped conductive layer 102. In response to the top surface of the conductive transport layer 104 being arranged no higher than the top surface of the doped conductive layer 102, the top surface of the conductive transport layer 104 is prevented from extending over the top surface of the doped conductive layer 102, so that the side surface of the conductive transport layer 104 is prevented from absorbing the incident light, thereby reducing the parasitic absorption capability of the conductive transport layer 104 to incident light. It can be understood that in response to the top surface of the conductive transport layer 104 being lower than the top surface of the doped conductive layer 102, the top surface of the doped conductive layer 102 will play a certain role of sheltering on the incident light incident obliquely to the top surface of the conductive transport layer 104. Therefore, the transport capability of the conductive transport layer 104 to incident light can be further reduced. In response to the top surface of the conductive transport layer 104 being flush with the top surface of the doped conductive layer 102, the production process of the solar cell 110 can be simplified, and the conductive transport layer 104 and the doped conductive layer 102 can be formed in the same step by laser ablation.

In some embodiments, along the direction perpendicular to the surface of the substrate 100, the height of the conductive transport layer 104 may be 0.5 to 1.2 times the height of the doped conductive layer 102, and the specific value may be 0.5, 0.6, 0.7, 0.8, 0.9, 1 or 1.2. Within this range, on the one hand, the thickness of the conductive transport layer 104 will not be excessively small, so that the lateral transport capability of the conductive transport layer 104 to carriers will not be too poor. On the other hand, the thickness of the conductive transport layer 104 is not excessive, so as to prevent the incident light from being excessively absorbed due to excessive thickness of the conductive transport layer 104. Referring to FIG. 3, in other embodiments, the top surface of the first connecting portion 11 is lower than or flush with the top surface of the main body portion 10. In response to the top surface of the first connecting portion 11 being lower than the top surface of the main body portion 10, the top surface of the main body portion 10 will block the incident light obliquely incident on the top surface of the first connecting portion 11 to a certain extent, so that the transport capability of the first connecting portion 11 to incident light can be further reduced. In response to the top surface of the first connecting portion 11 being flush with the top surface of the main body portion 10, the production process of the solar cell 110 can be simplified, and the first connecting portion 11 and the main body portion 10 can be formed in the same step by laser ablation. In some embodiments, in the direction perpendicular to the surface of the substrate 100, the height of the first connecting portion 11 may be 0.5 to 1.2 times the height of the main body portion 10, and the specific value may be 0.5, 0.6, 0.7, 0.8, 0.9, 1 or 1.2.

Figure 5:
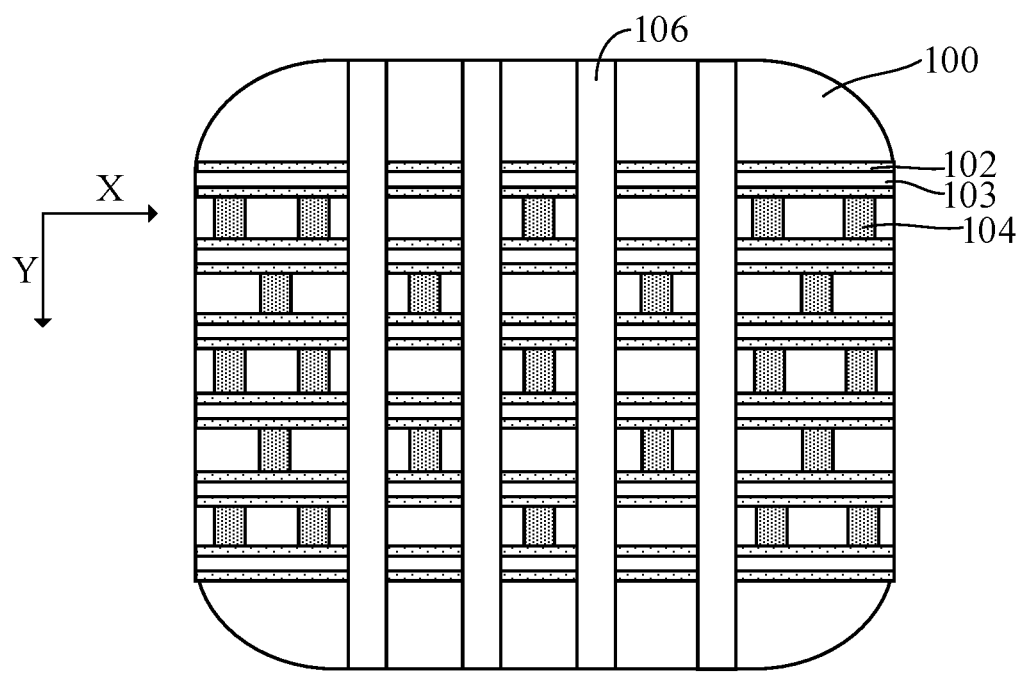
FIG. 5 is a schematic structural view of a top view of another solar cell provided according to an embodiment of the present disclosure.
Figure 6:
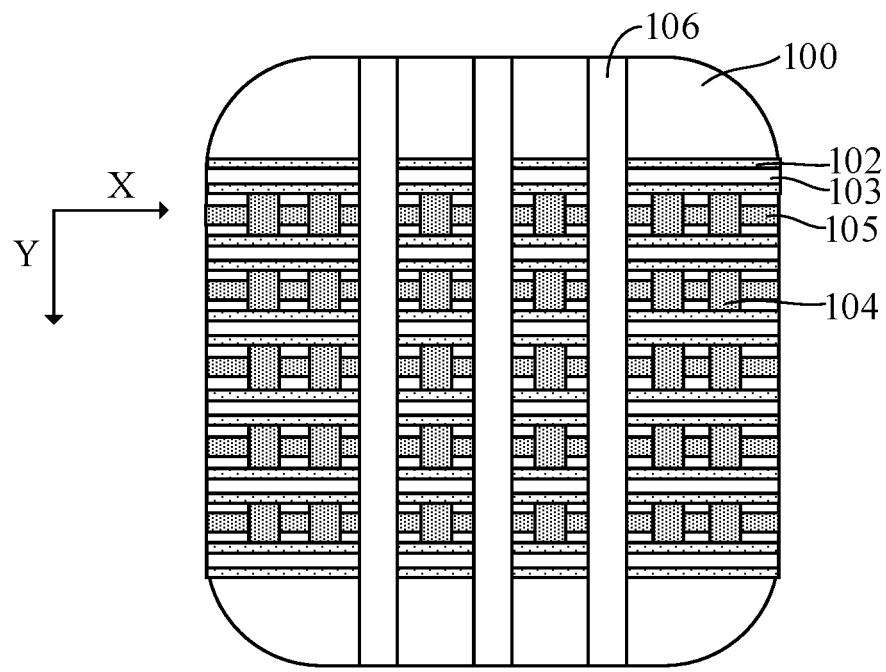
FIG. 6 is a schematic structural view of a top view of yet another solar cell provided according to an embodiment of the present disclosure.

Referring to FIG. 5 and FIG. 6, FIG. 5 is a schematic structural view of a top view of another solar cell provided according to an embodiment of the present disclosure, and FIG. 6 is a schematic structural view of a top view of yet another solar cell provided according to an embodiment of the present disclosure. In some embodiments, a column of conductive transport layers 104 and an adjacent column of conductive transport layers 104 are arranged in a stagger manner along the first direction X.

Specifically, in some embodiments, each conductive transport layer 104 in the first column of conductive transport layers 104 and each conductive transport layer 104 in the second column of conductive transport layers 104 are not aligned in the second direction Y, That is, each conductive transport layer 104 in the first column of conductive transport layers 104 and each conductive transport layer 104 in the second column of conductive transport layers 104 are staggered in the first direction X. Multiple conductive transport layers 104 are arranged in a stagger manner, on the one hand, the number of conductive transport layers 104 is prevented from being excessive, thereby preventing the conductive transport layers 104 from absorbing more incident light. On the other hand, the conductive transport layers 104 can be uniformly distributed on the first surface of the substrate 100, while the number of the conductive transport layers 104 is relatively small, so that the lateral transport capability of carriers at different positions in the substrate 100 can be enhanced.

Referring to FIG. 1, in other embodiments, each conductive transport layer 104 in a column of conductive transport layers 104 is in one-to-one correspondence with each conductive transport layer 104 in an adjacent column of conductive transport layers 104, and corresponding two conductive transport layers 104 are arranged at intervals along the second direction Y. For example, each conductive transport layer 104 in the first column of conductive transport layers 104 and the corresponding conductive transport layer 104 in the second column of conductive transport layers 104 are aligned and arranged in the second direction Y, and each column of conductive transport layers 104 are aligned and arranged, so that the number of conductive transport layers 104 is increased, thereby forming more lateral transport channels to laterally transport carriers in the substrate 100. In addition, since the conductive transport layers 104 in each column are aligned and arranged, in the actual process of preparing the conductive transport layers 104, the process of forming the conductive transport layers 104 can be simplified.

Referring to FIG. 1, FIG. 5 and FIG. 6, in some embodiments, the solar cell 110 further includes multiple second electrodes 106 arranged at intervals, where the multiple second electrodes 106 extend along the second direction Y, and are electrically connected to the multiple first electrodes arranged at intervals along the second direction Y. The multiple second electrodes 106 are arranged at intervals along the first direction X, and the multiple second electrodes 106 are electrically connected to the multiple first electrodes 103, so as to collect current in the multiple first electrodes 103, and the current is lead out of the solar cell 110. It can be understood that the second electrode 106 is not only in electrical contact with the first electrode 103, but also in electrical contact with a part of the doped conductive layer 102, so that the carriers in the doped conductive layer 102 can be directly transported to the multiple second electrodes 106 without passing through the multiple first electrodes 103, thereby improving the capability of the second electrode 106 to collect current.

In some embodiments, in a column of conductive transport layers 104, at least one second electrode 106 is disposed between two adjacent conductive transport layers 104. That is to say, the second electrode 106 is spaced apart from the conductive transport layer 104. In this way, the second electrode 106 can be position-limited by the conductive transport layer 104, so that position of the second electrode 106 can be determined without performing additional positioning during the process of preparing the second electrode 106, which facilitates the printing of the second electrode 106 and simplifies the process procedure.

Referring to FIG. 5 to FIG. 6, specifically, in some embodiments, in a column of conductive transport layers 104, two second electrodes 106 are disposed between two adjacent conductive transport layers 104. That is to say, the conductive transport layers 104 are sparsely disposed, so that the incident light is prevented from being excessively absorbed by the conductive transport layers 104 due to excessive quantity of the conductive transport layers 104.

It can be understood that since the conductive transport layers 104 serve as lateral transport channels for carriers, the carrier concentration in the doped conductive layer 102 adjacent to the conductive transport layers 104 is relatively high, so that a part of the first electrode 103 electrically connected to the doped conductive layer 102 adjacent to the conductive transport layers 104 has a higher carrier concentration. Based on this, in some embodiments, a column of conductive transport layers 104 and an adjacent column of conductive transport layers 104 are disposed in a stagger manner along the first direction X, and two conductive transport layers 104 belong to different columns of the conductive transport layers 104 and disposed in a stagger manner are located on opposite sides of the second electrode 106, respectively. The conductive transport layers 104 located on two sides of the second electrode 106 are not aligned in the first direction X. In this way, in response to the number of the conductive transport layers 104 being limited, the conductive transport layers 104 are uniformly distributed on two sides of the second electrode 106. The conductive transport layers 104 are arranged on two sides of the second electrode 106, that is, the second electrode 106 is electrically connected to the part of the first electrode 103 with higher carrier concentration, so that the collection capability of the second electrode 106 on current in the first electrode 103 can be integrally improved. In addition, due to the small number of conductive transport layers 104, the incident light is prevented from being excessively absorbed by the conductive transport layers 104, thereby improving the overall photoelectric conversion performance of the solar cell 110.

It can be understood that, in other embodiments, a projection of a part of the second electrode 106 on the first surface of the substrate 100 may also overlap a part of the conductive transport layer 104. In this way, the second electrode 106 can cover a part of the top surface of the conductive transport layer 104 to partially shield the conductive transport layer 104, thereby reducing the parasitic light absorption capability of the conductive transport layer 104 to incident light, and further improving the photoelectric conversion efficiency of the solar cell 110. In some embodiments, the solar cell 110 further includes a second connecting portion 105, the second electrode 106 is also in direct electrical contact with the second connecting portion 105 being covered, and the second connecting portion 105 is configured to be a lateral transport channel between adjacent second electrodes 106, so that the carriers in the second connecting portion 105 and the conductive transport layer 104 are also directly transported to the second electrode 106, which further improves the current collecting capability of the second electrode 106.

It can be understood that, in a step of laminating the solar cell 110, in order to prevent solar cell pieces from being crushed, the second electrode 106 is generally disposed far from edges of the solar cell pieces, that is, edges of the substrate 100 are spaced from the second electrode 106, which causes the number of second electrodes 106 at the edges of the substrate 100 to be less, so that the second electrode 106 located at the outermost of the edges has a weaker capability to collect carriers at the edges of the substrate 100. Based on this, in some embodiments, the substrate 100 includes a peripheral area and a central area, the peripheral area is defined as a periphery of the second electrode 106 located at an outermost side, the central area is defined as an area of the substrate 100 apart from the peripheral area, and a distance between every two adjacent conductive transport layers 104 located in the peripheral area in the first direction X is smaller than a distance between every two adjacent conductive transport layers 104 located in the central area in the first direction X. In this way, the density of the conductive transport layer 104 on the first surface of the substrate 100 in the peripheral area is greater than that in the central area, that is, the lateral transport capability of carriers in the substrate 100 corresponding to the peripheral area is stronger, so that the carrier concentration in the first electrode 103 in the peripheral area is relatively higher, so as to compensate the number of carriers collected by the outermost second electrode 106 and improve the current collecting capability of the outermost second electrode 106.

In some embodiments, among the conductive transport layers 104 in each column, there are multiple conductive transport layers 104 in the peripheral area, and there is one conductive transport layer 104 or no conductive transport layer 104 between two adjacent second electrodes 106 in the central area. That is to say, the conductive transport layer 104 is sparsely distributed in the central area, thereby reducing the parasitic light absorption capability of the conductive transport layer 104 to incident light. In the peripheral area, the conductive transport layer 104 is densely distributed, so as to improve the current collecting capability of the outermost second electrode 106, thereby further integrally improving the photoelectric conversion performance of the solar cell 110.

Specifically, referring to FIG. 5, in some embodiments, among the first column of conductive transport layers 104 in the peripheral area, the number of the conductive transport layers 104 on the outermost second electrode 106 side may be 2, and among the second column of conductive transport layers 104 in the peripheral area, the number of the conductive transport layers 104 on the outermost second electrode 106 side may be 1, and the first column of conductive transport layers 104 are disposed in a stagger manner with the second column of conductive transport layers 104. Only the arrangement of first column and the second column of the conductive transport layers 104 is shown here, and reference may be made to the first column and the second column for the arrangement of the conductive transport layers 104 in the remaining third, fourth, fifth and sixth columns.

Figure 7:
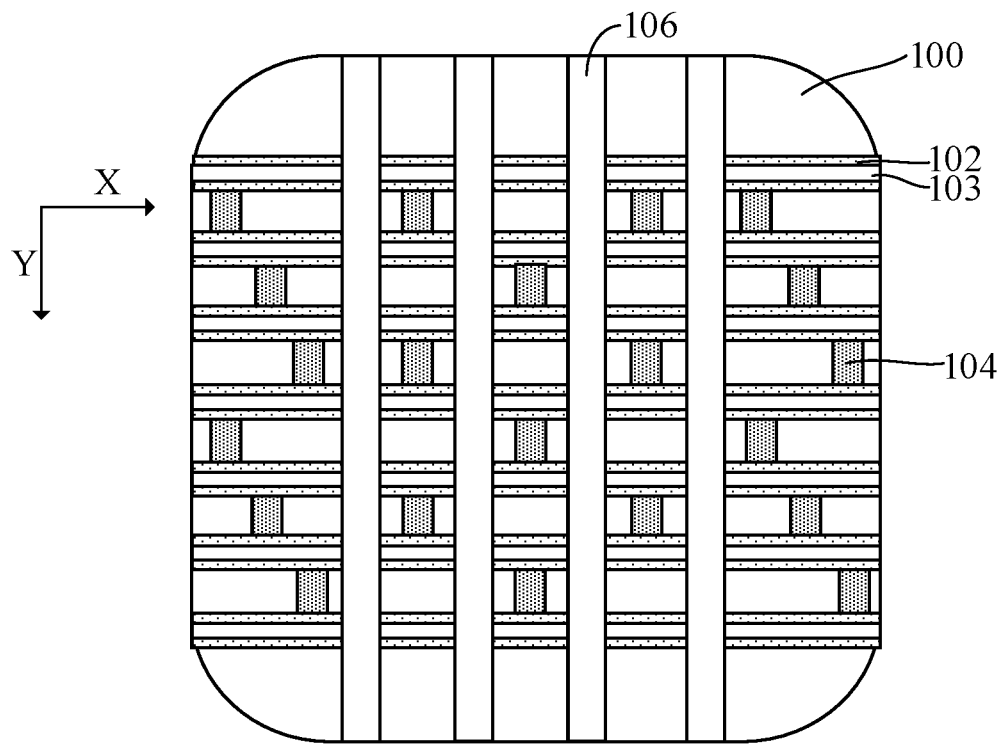
FIG. 7 is a schematic structural view of a top view of still another solar cell provided according to an embodiment of the present disclosure.

Referring to FIG. 7, in other embodiments, among the first column of conductive transport layers 104 in the peripheral area, the number of the conductive transport layers 104 on the outermost second electrode 106 side may be one, among the second column of conductive transport layers 104 in the peripheral area, the number of the conductive transport layers 104 on the outermost second electrode 106 side may be one, and among the third column of conductive transport layers 104 in the peripheral area, the number of the conductive transport layers 104 on the outermost second electrode 106 side may be one. The adjacent three columns of the conductive transport layers 104 are disposed in a stagger manner along the first direction X. Only the arrangement of the conductive transport layers 104 in the first, second and third columns is shown here, and reference may be made to the first column, the second column and the third column of conductive transport layers 104 for the arrangement of the conductive transport layers 104 in the remaining columns.

In some embodiments, in each column of the conductive transport layers 104 located in the central area, a distance between every two adjacent conductive transport layers 104 in the first direction X is constant. In each column of the conductive transport layers 104, the distance between every two adjacent conductive transport layers 104 is constant, which facilitates the laser ablation process during the formation process, that is, it is not necessary to adjust the distance between every two adjacent conductive transport layers 104, thereby facilitating the production. In addition, the distance between every two adjacent conductive transport layers 104 in the central area are constant, so that the conductive transport layers 104 in the central area are evenly distributed, thereby uniformly improving the carrier collecting capability of the second electrode 106 at different positions.

In some embodiments, in each column of the conductive transport layers 104 located in the central area, the distance between every two adjacent conductive transport layers 104 ranges from 0.01 mm to 20 mm, for example, the distance may range from 0.01 mm to 0.1 mm, from 0.1 mm to 0.5 mm, from 0.5 mm to 2 mm, from 2 mm to 5 mm, from 5 mm to 10 mm, from 10 mm to 15 mm, or from 15 mm to 20 mm. in each column of the conductive transport layers located in the peripheral area, the distance between every two adjacent conductive transport layers 104 ranges from 0.005 mm to 18 mm, for example, the distance may range from 0.005 mm to 0.01 mm, from 0.01 mm to 0.1 mm, from 0.1 mm to 0.5 mm, from 0.5 mm to 2 mm, from 2 mm to 5 mm, from 5 mm to 10 mm, from 10 mm to 15 mm, or from 15 mm to 18 mm. Within this range, on the one hand, the distance between adjacent conductive transport layers 104 is not too small, so as to prevent the conductive transport layers 104 from absorbing too much incident light due to excessively dense arrangement of the conductive transport layers 104; on the other hand, within this range, the distance between every two adjacent conductive transport layers 104 is not too small, so that more lateral transport channels are formed, which can greatly improve the lateral transport capability of carriers in the substrate 100.

Referring to FIG. 6, FIG. 6 is a schematic structural view of a top view of yet another solar cell provided according to an embodiment of the present disclosure. In some embodiments, the solar cell 110 further includes: a second connecting portion 105, the second connecting portion 105 is located between adjacent conductive transport layers 104 arranged at intervals along the first direction X, and is electrically connected to side surfaces of the two adjacent conductive transport layers 104. It can be understood that the width of the second connecting portion 105 in the second direction Y is smaller than the distance between two adjacent doped conductive layers 102 in the second direction Y, that is, a side surface of the second connecting portion 105 is not in contact with the side surfaces of the two adjacent doped conductive layers 102. In this way, in response to incident light irradiating the gap between the doped conductive layer 102 and the second connecting portion 105, the incident light will not be absorbed by the second connecting portion 105 or the doped conductive layer 102. In some embodiments, the second connecting portion 105 may be made of the same material as the conductive transport layer 104, so that the second connecting portion 105 may also serve as a lateral transport channel for carriers in the substrate 100. Specifically, the carriers in the substrate 100 corresponding to the second connecting portion 105 can be transported to the second connecting portion 105, the carriers in the second connecting portion 105 are then transported to the conductive transport layer 104, and the carriers are transported to the doped conductive layer 102 through the conductive transport layer 104. It is not difficult to find that due to the second connecting portion 105, more carriers in the substrate 100 can be transported to the conductive transport layer 104 and finally reach the doped conductive layer 102, thereby improving the lateral transport capability of the carriers in the substrate 100. Therefore, the carrier concentration in the doped conductive layer 102 is bigger, thereby increasing the current collecting capability of the first electrode 103.

Figure 8:
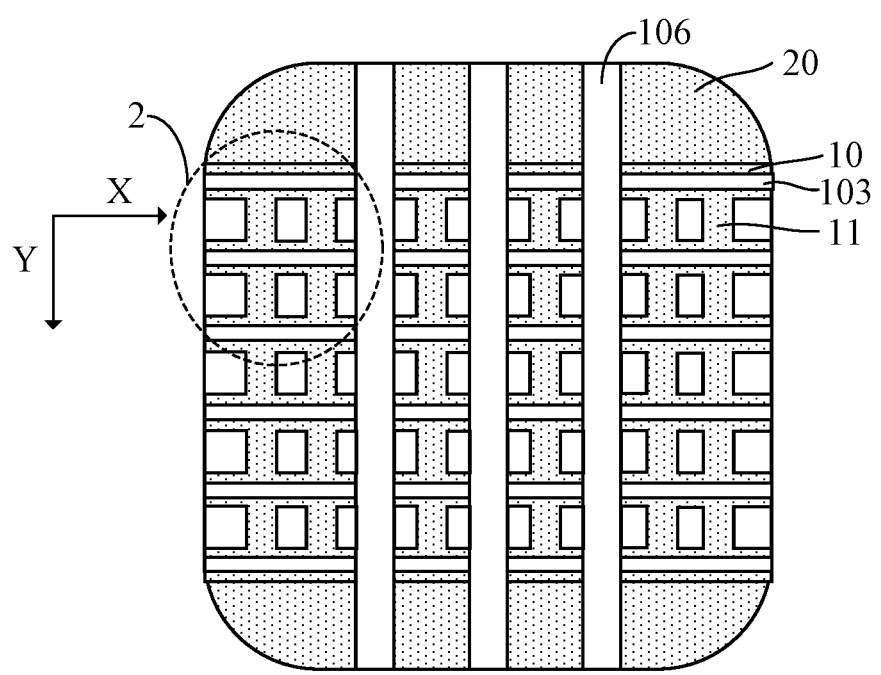
FIG. 8 is a schematic structural view of a top view of a solar cell provided according to another embodiment of the present disclosure.
Figure 9:
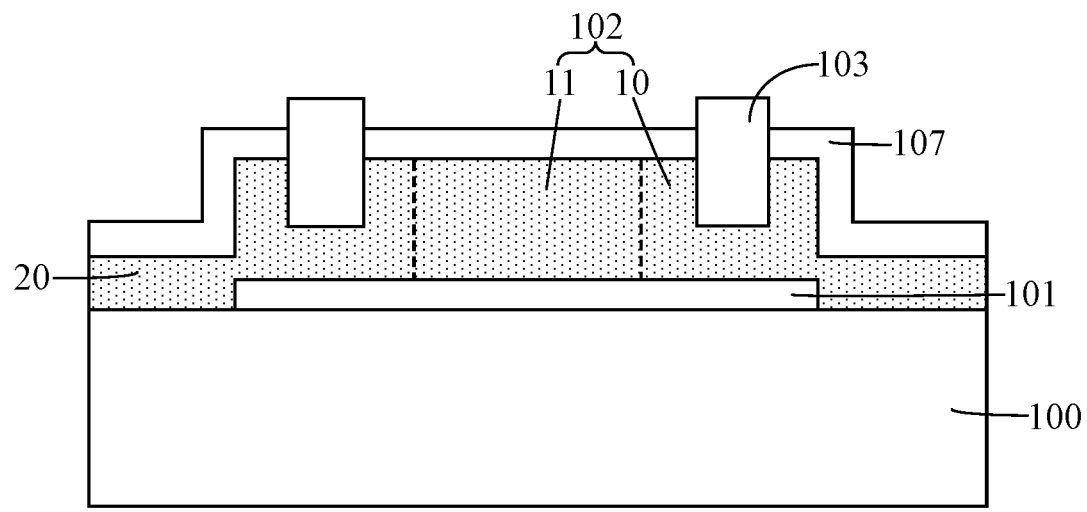
FIG. 9 is a partial enlarged view of 2 shown in FIG. 8.

Referring to FIG. 8 and FIG. 9, in some other embodiments, the doped conductive layer 102 further includes: a bottom connecting portion 20, and the bottom connecting portion 20 is located between two adjacent main body portions 10 and is connected to side surfaces of two adjacent main body portions 10. The top surface of the bottom connecting portion 20 is lower than the top surface of the main body portion 10, and the first connecting portion 11 is located on a part of the top surface of the bottom connecting portion 20. That is to say, the thickness of the doped conductive layer 102 on the surface of the substrate 100 corresponding to the non-metallized area is thinner than that of the doped conductive layer 102 on the surface of the substrate 100 corresponding to the metallized area, so that the parasitic absorption of incident light done by the doped conductive layer 102 corresponding to the non-metallized area can be reduced. In addition, the bottom connecting portion 20 located in the non-metallized area is further configured to provide a transport channel for majority carriers between adjacent main body portions 10.

It can be seen from the above analysis that for the solution in which the doped conductive layer 102 only includes the main body portion 10, the doped conductive layer 102 corresponding to the non-metallized area is removed, and for the solution in which the doped conductive layer 102 further includes the bottom connecting portion 20, the doped conductive layer 102 corresponding to the non-metallized area is thinned, so that the carrier transport capability of the substrate 100 corresponding to the non-metallized area is relatively weak. Based on this, the first connecting portion 11 is arranged between the two adjacent main body portions 10 to provide a lateral transport channel between the two adjacent main body portions 10 for majority carriers, so that the transport efficiency of carriers in the substrate 100 and between the doped conductive layers 102 is increased, thereby improving the filling factor of the solar cell 110 and the photoelectric conversion efficiency of the solar cell 110.

The tunneling dielectric layer 101 and the main body portions 10 are stacked. Specifically, in some embodiments, the tunneling dielectric layer 101 covers the entire first surface of the substrate 100, and the multiple main body portions 10 are disposed at intervals on the top surface of the tunneling dielectric layer 101. In other embodiments, the tunneling dielectric layer 101 is disposed corresponding to the main body portions 10, that is, the tunneling dielectric layer 101 is disposed between the main body portions 10 and the substrate 100, and the tunneling dielectric layer 101 is also located between the conductive transport layer 104 and the substrate 100, so that a part of the tunneling dielectric layer 101 reduces the recombination of carriers on the first surface of the substrate 100, thereby increasing the concentration of carriers transported to the conductive transport layer 104.

The main body portion 10 and the first connecting portion 11 are integrally formed, on the one hand, the types of materials in the whole production process can be reduced, so as to facilitate management. On the other hand, the first connecting portion 11 and the main body portion 10 are made to have the same carrier type and carrier concentration, so that the transport of carriers at an interface between the main body portion 10 and the first connecting portion 11, thereby reducing transport loss. In addition, the transport rate of carriers in the main body portion 10 and the first connecting portion 11 can be made the same, thereby improving the transport efficiency of carriers from the first connecting portion 11 to the main body portion 10.

Referring to FIG. 5 and FIG. 7, in some embodiments, a column of the first connecting portions 11 and an adjacent column of the first connecting portions 11 are disposed in a stagger manner along the first direction X. Specifically, in some embodiments, each first connecting portions 11 in the first column of first connecting portions 11 and each first connecting portions 11 in the second column of first connecting portions 11 are not aligned in the second direction Y, that is each first connecting portions 11 in the first column of first connecting portions 11 and each first connecting portions 11 in the second column of first connecting portions 11 are arranged in a stagger manner in the first direction X. By arranging multiple first connecting portions 11 in a stagger manner, on the one hand, the number of first connecting portions 11 is prevented from being excessive, thereby preventing the first connecting portions 11 from absorbing too much incident light. On the other hand, the first connecting portions 11 can be uniformly distributed on the first surface of the substrate 100, while the number of the conductive transport layers 104 is relatively small, so that the lateral transport capability of carriers at different positions in the substrate 100 can be enhanced.

In some embodiments, each first connecting portion 11 in a column of first connecting portions 11 is in one-to-one correspondence with each first connecting portion 11 in an adjacent column of first connecting portions 11, and two corresponding first connecting portions 11 are arranged at intervals along the second direction Y. That is, each first connecting portion 11 in the first column of first connecting portions 11 and the corresponding first connecting portion 11 in the second column of first connecting portions 11 are aligned and arranged in the second direction Y, and each column of first connecting portions 11 are aligned and arranged, so that the number of conductive transport layers 104 is increased, thereby forming more lateral transport channels to laterally transport carriers in the substrate 100. In addition, since the first connecting portions 11 in each column are aligned and arranged, in the actual process of preparing the first connecting portions 11, the process of forming the first connecting portions 11 can be simplified.

Referring back to FIG. 1, FIG. 5 and FIG. 6, in some embodiments, the solar cell 110 further includes multiple second electrodes 106 arranged at intervals, where the multiple second electrodes 106 extend along the second direction Y, and are electrically connected to the multiple first electrodes arranged at intervals along the second direction Y. The multiple second electrodes 106 are arranged at intervals along the first direction X, and the multiple second electrodes 106 are electrically connected to the multiple first electrodes 103, so as to collect current in the multiple first electrodes 103, and the current is lead out of the solar cell 110. It can be understood that the second electrode 106 is not only in electrical contact with the first electrode 103, but also in electrical contact with a part of the doped conductive layer 102, so that the carriers in the doped conductive layer 102 can be directly transported to the multiple second electrodes 106 without passing through the multiple first electrodes 103, thereby improving the capability of the second electrode 106 to collect current.

In some embodiments, the second electrodes 106 and the first connecting portions 11 are arranged at intervals, or a projection of the first connecting portion 11 on the substrate 100 at least partially overlaps a projection of the second electrode 106 on the substrate 100. By arranging the second electrodes 106 and the first connecting portions 11 at intervals, the second electrode 106 can be position-limited by the first connecting portion 11, so that position of the second electrode 106 can be determined without performing additional positioning during the process of preparing the second electrode 106, which facilitates the printing of the second electrode 106 and simplifies the process flow.

The projection of the first connecting portion 11 on the substrate 100 at least partially overlaps the projection of the second electrode 106 on the substrate 100, that is to say, a part of the second electrodes 106 can cover a part of the top surface of the first connecting portion 11 to shield a part of the first connecting portion 11, so as to reduce the parasitic light absorption capability of the first connecting portion 11 to incident light, thereby further improving the photoelectric conversion efficiency of the solar cell 110. In some embodiments, the second electrode 106 is also in direct electrical contact with the covered first connecting portion 11, since the first connecting portion 11 and the main body portion 10 are integrally formed, and the first connecting portion 11 and the main body portion 10 are both in electrical contact with the second electrodes 106, so that a lateral transport channel is also formed between the adjacent second electrodes 106, the carriers in the first connecting portion 11 can also be directly transported to the second electrodes 106, and thereby further improving the current collecting capability of the second electrodes 106.

It can be understood that since the first connecting portions 11 serve as lateral transport channels for carriers, the carrier concentration in the main body portions 10 adjacent to the first connecting portions 11 is relatively high, so that a part of the first electrode 103 electrically connected to the main body portions 10 adjacent to the first connecting portions 11 has a higher carrier concentration. Based on this, in some embodiments, a column of first connecting portions 11 and an adjacent column of first connecting portions 11 are disposed in a stagger manner along the first direction X, and two first connecting portions 11 belong to different columns of the first connecting portions 11 and disposed in a stagger manner are located on opposite sides of the second electrode 106, respectively. The first connecting portions 11 located on two sides of the second electrode 106 are not aligned in the first direction X. In this way, in response to the number of the first connecting portions 11 being limited, the first connecting portions 11 are uniformly distributed on two sides of the second electrode 106. The first connecting portions 11 are arranged on two sides of the second electrode 106, that is, the second electrode 106 is electrically connected to the part of the first electrode 103 with higher carrier concentration, so that the collection capability of the second electrode 106 on current in the first electrode 103 can be integrally improved. In addition, due to the small number of first connecting portions 11, the incident light is prevented from being excessively absorbed by the first connecting portions 11, thereby improving the overall photoelectric conversion performance of the solar cell 110.

It can be understood that, in a step of laminating the solar cell 110, in order to prevent solar cell pieces from being crushed, the second electrode 106 is generally disposed far from edges of the solar cell pieces, that is, edges of the substrate 100 are spaced from the second electrode 106, which causes the number of second electrodes 106 at the edges of the substrate 100 to be less, so that the second electrode 106 located at the outermost of the edges has a weaker capability to collect carriers at the edges of the substrate 100. Based on this, in some embodiments, the substrate 100 includes a peripheral area and a central area, the peripheral area is defined as a periphery of the second electrode 106 located at an outermost side, the central area is defined as an area of the substrate 100 apart from the peripheral area, and a distance between every two adjacent first connecting portions 11 located in the peripheral area in the first direction X is smaller than a distance between every two adjacent first connecting portions 11 located in the central area in the first direction X. In this way, the density of the first connecting portions 11 on the first surface of the substrate 100 in the peripheral area is greater than that in the central area, that is, the lateral transport capability of carriers in the substrate 100 corresponding to the peripheral area is stronger, so that the carrier concentration in the first electrode 103 in the peripheral area is relatively higher, so as to compensate the number of carriers collected by the outermost second electrode 106 and improve the current collecting capability of the outermost second electrode 106.

In some embodiments, in the first connecting portions 11 of each column, the number of the first connecting portions 11 located in the peripheral area is multiple, and in the central area, the first connection between two adjacent second electrodes 106 The number of the parts 11 is one or zero.

Specifically, referring to FIG. 8, in some embodiments, among the first column of first connecting portions 11 in the peripheral area, the number of the first connecting portions 11 on the outermost second electrode 106 side may be 2, and among the second column of first connecting portions 11 in the peripheral area, the number of the first connecting portions 11 on the outermost second electrode 106 side may be 1, and the first column of first connecting portions 11 are disposed in a stagger manner with the second column of first connecting portions 11. Only the arrangement of first column and the second column of the first connecting portions 11 is shown here, and reference may be made to the first column and the second column for the arrangement of the first connecting portions 11 in the remaining third, fourth, fifth and sixth columns.

Figure 10:
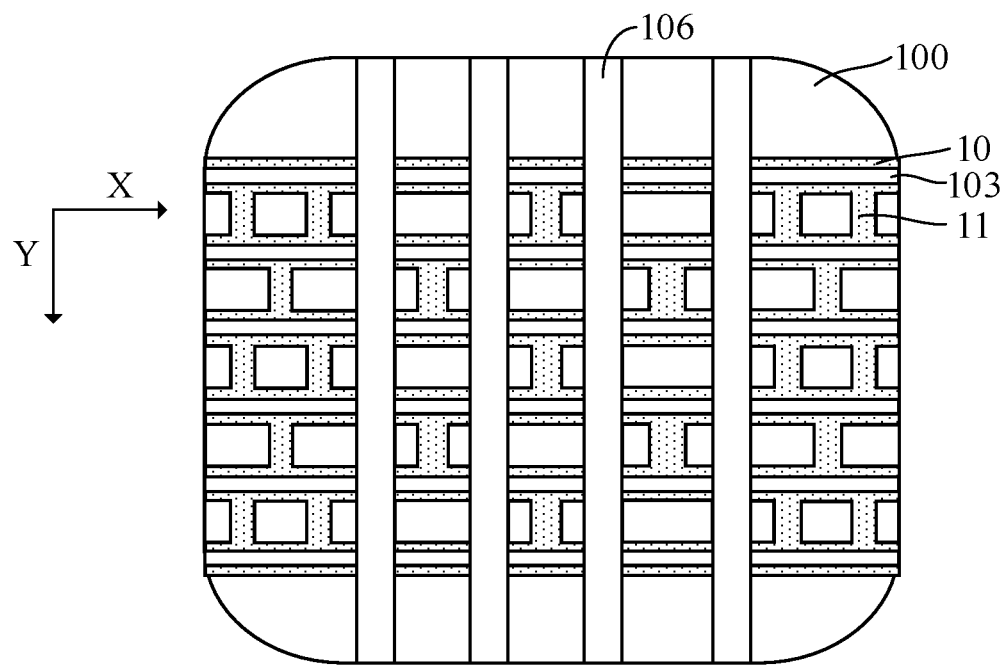
FIG. 10 is a schematic structural view of a top view of another solar cell provided according to another embodiment of the present disclosure.
Figure 11:
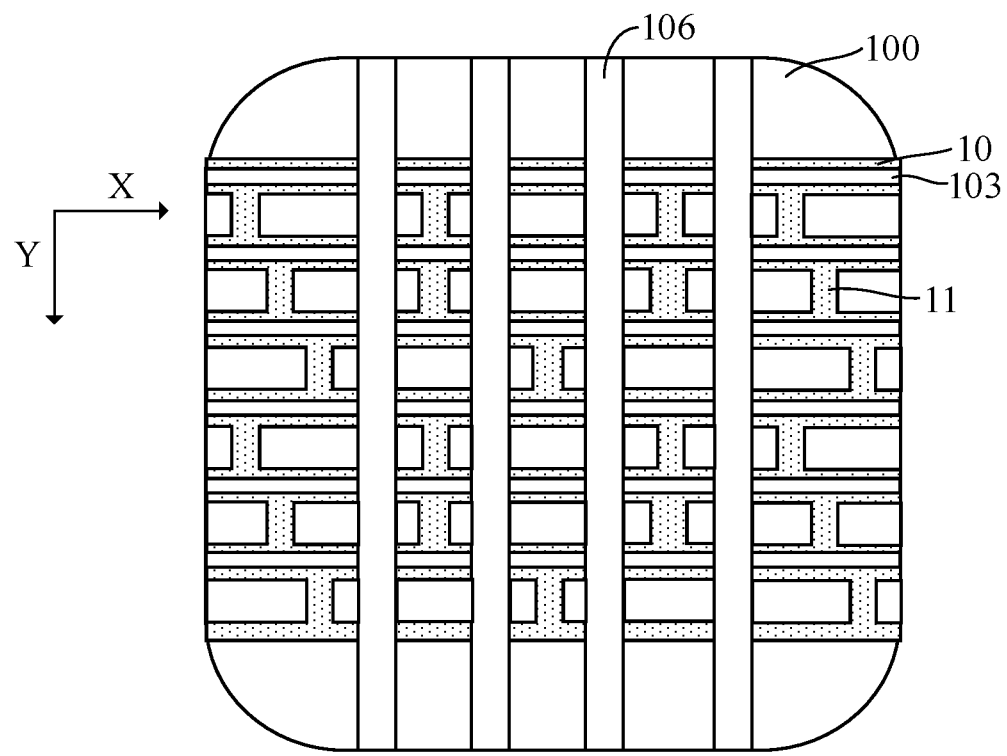
FIG. 11 is a schematic structural view of a top view of yet another solar cell provided according to another embodiment of the present disclosure.

Referring to FIG. 10, in other embodiments, among the first column of first connecting portions 11 in the peripheral area, the number of the first connecting portions 11 on the outermost second electrode 106 side may be one, among the second column of first connecting portions 11 in the peripheral area, the number of the first connecting portions 11 on the outermost second electrode 106 side may be one, and among the third column of first connecting portions 11 in the peripheral area, the number of the first connecting portions 11 on the outermost second electrode 106 side may be one. The adjacent three columns of the first connecting portions 11 are disposed in a stagger manner along the first direction X. Only the arrangement of the first connecting portions 11 in the first, second and third columns is shown here, and reference may be made to the first column, the second column and the third column of first connecting portions 11 for the arrangement of the first connecting portions 11 in the remaining columns.

In some embodiments, in each column of the first connecting portions 11 located in the central area, the distance between every two adjacent first connecting portions 11 ranges from 0.01 mm to 20 mm, for example, the distance may range from 0.01 mm to 0.1 mm, from 0.1 mm to 0.5 mm, from 0.5 mm to 2 mm, from 2 mm to 5 mm, from 5 mm to 10 mm, from 10 mm to 15 mm, or from 15 mm to 20 mm. in each column of the first connecting portions 11 located in the peripheral area, the distance between every two adjacent first connecting portions 11 ranges from 0.005 mm to 18 mm, for example, the distance may range from 0.005 mm to 0.01 mm, from 0.01 mm to 0.1 mm, from 0.1 mm to 0.5 mm, from 0.5 mm to 2 mm, from 2 mm to 5 mm, from 5 mm to 10 mm, from 10 mm to 15 mm, or from 15 mm to 18 mm. Within this range, on the one hand, the distance between adjacent first connecting portions 11 is not too small, so as to prevent the first connecting portions 11 from absorbing too much incident light due to excessively dense arrangement of the first connecting portions 11; on the other hand, within this range, the distance between every two adjacent first connecting portions 11 is not too small, so that more lateral transport channels are formed, which can greatly improve the lateral transport capability of carriers in the substrate 100.

Figure 12:
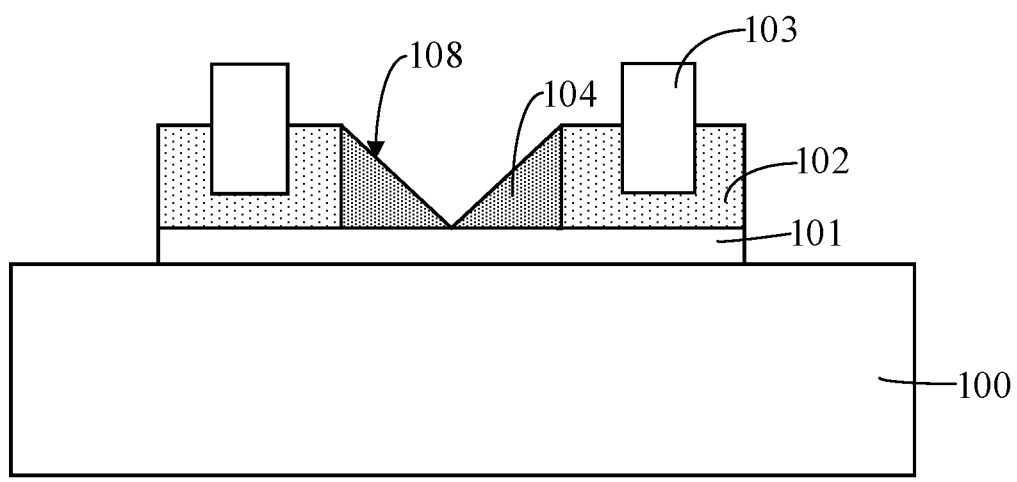
FIG. 12 is still another partial enlarged view of 1 shown in FIG. 1.
Figure 13:
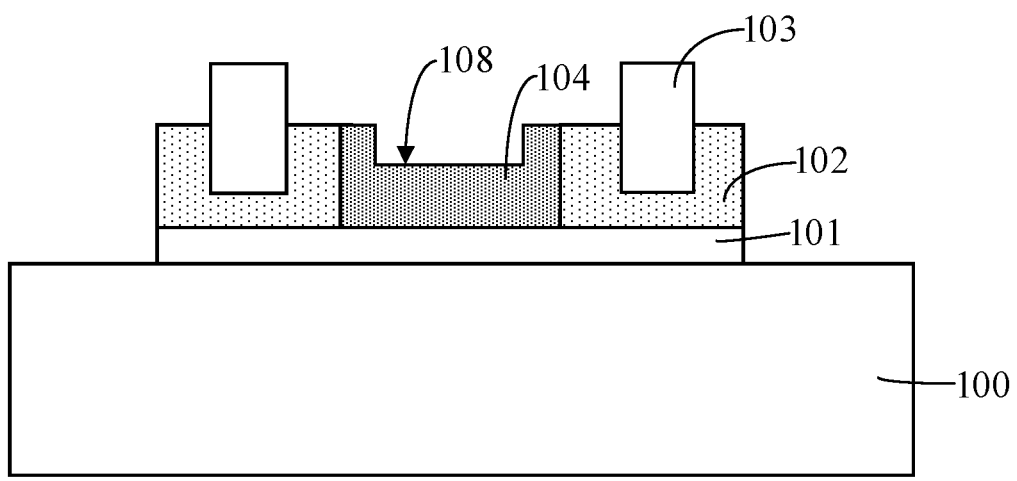
FIG. 13 is yet still another partial enlarged view of 1 shown in FIG. 1.

Referring to FIG. 12 to FIG. 13, in some embodiments, the top surface of the conductive transport layer 104 has a light trapping structure 108. The light trapping structure 108 is configured to enhance the reflection capability of the top surface of the conductive transport layer 104 to the incident light, so that the incident light irradiating on the top surface of the conductive transport layer 104 can be reflected and prevented from being absorbed by the conductive transport layer 104. This part of the reflected incident light can continue to be reflected back, for example, this part of the reflected incident light can be reflected to the area not covered by the doped conductive layer 102 and the conductive transport layer 104, so as to be absorbed and utilized by the substrate 100. In this way, the absorption and utilization rate of the substrate 100 to the incident light can be enhanced.

Specifically, referring to FIG. 12, in some embodiments, the light trapping structure 108 includes multiple pyramid structures, each of the multiple pyramid structures has a bottom surface and a side surface connected to the bottom surface. Incident light may be repeatedly reflected between side surfaces of two adjacent pyramid structures, so as to reflect the incident light irradiating on the top surface of the conductive transport layer 104 to out of the conductive transport layer 104, thereby reducing the absorption of the incident light done by the conductive transport layer 104. Moreover, since each of the pyramid structures has multiple side surfaces, reflection probability of the incident light is further increased, the absorption of the incident light done by the conductive transport layer 104 is further reduced. The reflected incident light can be re-reflected to a part of the first surface of the substrate 100 not covered by the doped conductive layer 102 and the conductive transport layer 104, which increases the utilization rate of incident light by the substrate 100, increases the open circuit voltage and short circuit current, thereby improving the photoelectric conversion efficiency of the solar cell 110.

In other embodiments, the light trapping structure 108 further includes a recessed structure that is recessed toward the substrate 100, and the recessed structure is provided, on the one hand, the top surface of the conductive transport layer 104 is lower than the top surface of the doped conductive layer 102, the doped conductive layer 102 has a certain shielding effect on the incident light irradiating on the top surface of the conductive transport layer 104. On the other hand, the incident light is enabled to be repeatedly reflected on sidewalls of the recessed structure, thereby reducing the parasitic absorption of the incident light by the top surface of the doped conductive layer 102.

Specifically, in some embodiments, along a direction in which the doped conductive layer 102 points to the center of the recessed structure, the height of the recessed structure gradually decreases. Referring specifically to FIG. 12, the recessed structure has two opposite sidewalls, the tops of the two opposite sidewalls are spaced apart from each other, and the bottoms are connected, that is, the two sidewalls of the recessed structure are inclined relative to the first surface of the substrate 100. In this way, in response to the incident light irradiating one of two sidewall surfaces, one part of the incident light will be reflected from a first sidewall surface to a second sidewall surface, and after that, in the incident light reflected to the second sidewall surface, one part of the incident light will be reflected to the outside, and the other part of the incident light will be re-reflected from the second sidewall surface to the first sidewall surface. In this way, after the incident light is reflected multiple times, the incident light is substantially emitted to the outside, so that the incident light emitted to the outside has a high probability of being re-reflected to a part of the first surface the substrate 100 that is not covered by the doped conductive layer 102 and the conductive transport layer 104.

In other embodiments, referring to FIG. 13, in the direction in which the doped conductive layer 102 points to the substrate 100, the cross-sectional shape of the recessed structure may also be a rectangle. That is, the recessed structure has two opposite side walls and a bottom wall, the two opposite side walls are perpendicular to the first surface of the substrate 100, and the bottom wall can be arranged parallel to the first surface of the substrate 100.

It can be understood that, in other embodiments, the recessed structure may also be in other shapes, as long as the recessed structure recesses toward the substrate 100.

Referring to FIG. 2, in some embodiments, the solar cell 110 further includes: a first passivation layer 107, a part of the first passivation layer 107 covers the first surface of the substrate 100, and the remaining part of the first passivation layer 107 covers the doped conductive layer 102 and the top surface of the conductive transport layer 104. That is to say, the tunneling dielectric layer 101 is disposed correspondingly to the doped conductive layer 102. The tunneling dielectric layer 101 is disposed between the doped conductive layer 102 and the substrate 100, and between the conductive transport layer 104 and the substrate 100, so that the tunneling dielectric layer 101 only covers a part of the surface of the substrate 100, and a part of the first passivation layer 107 can directly in contact with the first surface of the substrate 100. Since the conductive transport layer 104 is disposed between every two adjacent doped conductive layers 102, multiple lateral transport channels are formed in the substrate 100 in direct contact with the first passivation layer 107, and the carriers in the substrate 100 can move laterally into the doped conductive layer 102, thereby reducing the consumption of carriers in the transport process and increasing the transport rate. Moreover, since the doped conductive layers 102 are arranged at intervals and are only arranged in the metallized area (the area corresponding to the first electrode 103), in response to incident light irradiating the area between the adjacent doped conductive layers 102, the probability of incident light being absorbed is greatly reduced, and the parasitic absorption of incident light by the doped conductive layer 102 is integrally reduced. It can be seen from this that the solar cell 110 provided according to the embodiments of the present disclosure not only improve the utilization rate of the incident light by the solar cell 110, but also maintain a relatively high transport efficiency of carriers in the solar cell 110.

In some embodiments, the first passivation layer 107 may be a single-layer or multi-layer structure, and the first passivation layer 107 may be made of at least one of magnesium fluoride, silicon oxide, aluminum oxide, silicon oxynitride, silicon nitride, titanium oxide.

In other embodiments, a front surface of the tunneling dielectric layer 101 may also be disposed on the first surface of the substrate 100. Based on this, the first passivation layer 107 is disposed to partially cover the top surface of the doped conductive layer 102 and the top surface of the conductive transport layer 104. The remaining part of the first passivation layer 107 covers the first surface of the substrate 100.

In some embodiments, the first passivation layer 107 may be formed by using a plasma enhanced chemical vapor deposition (PECVD) method after the doped conductive layer 102 and the conductive transport layer 104 are formed.

The first electrode 103 penetrates through the first passivation layer 107 to be electrically connected to the doped conductive layer 102. The first passivation layer 107 is configured to reduce the reflection of the incident light by the substrate 100. In some embodiments, after the first passivation layer 107 is formed, multiple first electrodes 103 disposed at intervals are formed on a side of the doped conductive layer 102 away from the substrate 100, the first electrode 103 extends along the first direction X, and is electrically connected to the doped conductive layer 102.

In some embodiments, the second surface of the substrate 100 has an emitter with a type of doping ions in the emitter that is different from the type of doping ions in the doped conductive layer 102. In some embodiments, a surface of the emitter away from the substrate 100 further has an anti-reflection layer, and the anti-reflection layer is configured to anti-reflect incident light. In some embodiments, the anti-reflection layer may be a silicon nitride layer, and the silicon nitride layer is made of silicon nitride material. In other embodiments, the anti-reflection layer may also be provided in a multi-layer structure, for example, may be a stacked-layer structure composed of one or more materials selected from silicon nitride, silicon oxide, or silicon oxynitride.

In other embodiments, the second surface of the substrate 100 also has a structure similar to structures formed on the first surface of the substrate 100, for example, the second surface of the substrate 100 may have a second tunneling dielectric layer and a second doped conductive layer stacked in sequence along a direction away from the second surface of the substrate 100. The type of doping ions in the second doped conductive layer is different from the type of doping ions in the doped conductive layer 102.

In some embodiments, the solar cell 110 further includes a third electrode (not shown). The third electrode is located on the second surface of the substrate 100. In response to the second surface of the substrate 100 having an emitter, the third electrode penetrates through the anti-reflection layer to be electrically connected to the emitter. In response to the second surface of the substrate 100 being formed with structures similar to that of the first surface of the substrate 100, the third electrode is electrically connected to the second doped conductive layer.

In the solar cell 110 provided according to the above embodiments, the conductive transport layer 104 is arranged between every two adjacent doped conductive layers 102 in the multiple doped conductive layers 102 and in contact with the doped conductive layer 102, so that the majority carriers in the substrate 100 can be transported to the multiple doped conductive layer 102 through the conductive transport layer 104. In this way, the lateral transport of majority carriers in the substrate 100 is improved, the filling factor of the solar cell 110 is improved, the utilization rate of incident light is improved, and the transport capability of the majority carriers in the substrate 100 is improved, thereby improving the overall photoelectric conversion efficiency of solar cell.

Figure 14:
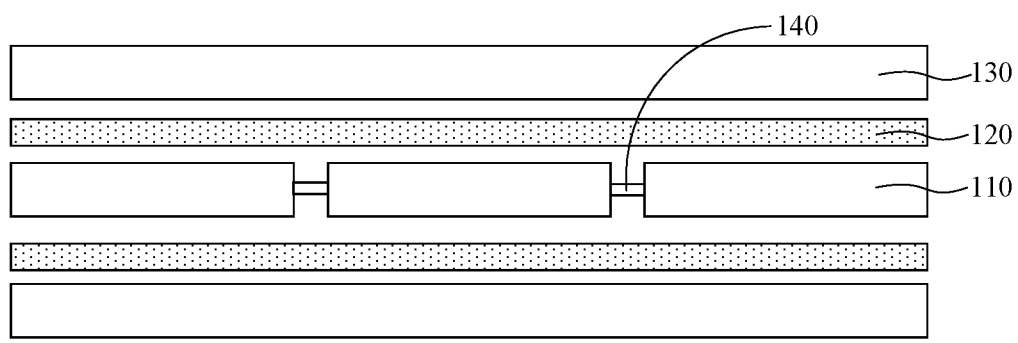
FIG. 14 is a schematic structural view of a photovoltaic module provided according to an embodiment of the present disclosure.

Correspondingly, a photovoltaic module is further provided according to an embodiment of the present disclosure. Referring to FIG. 14, the photovoltaic module includes at least one cell string, where the at least one cell string is formed by connecting multiple solar cells 110, each of the multiple solar cells 110 being a solar cell 110 according to any one above; at least one package layer 120 configured to cover a surface of the at least one cell string; at least one cover plate 130 configured to cover a surface of the at least one package layer 120 away from the at least one cell string. The solar cells 110 are electrically connected in the form of a whole piece or multiple pieces to form multiple cell strings, and the multiple cell strings are electrically connected in series and/or parallel.

Specifically, in some embodiments, the multiple cell strings are electrically connected by conductive strips 140. The package layer 120 covers the front surface and the back surface of the solar cell 110. Specifically, the package layer 120 may be embodied as an ethylene-vinyl acetate copolymer (EVA) adhesive film, a polyethylene octene co-elastomer (POE) adhesive film, a polyethylene terephthalate (PET) film, or other organic package films. In some embodiments, the cover plate 130 may be embodied as a cover plate 130 with a light-transmitting function, such as a glass cover plate, a plastic cover plate, or the like. Specifically, a surface of the cover plate 130 facing the package layer 120 may be a surface with protrusions and recess, thereby increasing the utilization rate of incident light.

Although the present disclosure is disclosed above with preferred embodiments, it is not used to limit the claims. Any person skilled in the art can make some possible changes and modifications without departing from the concept of the present disclosure. The scope of protection shall be subject to the scope defined by the claims of the present disclosure.

Those of ordinary skill in the art can understand that the above embodiments are specific examples for realizing the present disclosure, and in actual disclosures, various changes may be made in form and details without departing from the spirit and range of the present disclosure. Any person skilled in the art can make their own changes and modifications without departing from the spirit and scope of the present disclosure. Therefore, the protection scope of the present disclosure should be subject to the scope defined by the claims.

What is claimed is:

1. A solar cell, comprising:
 a substrate;
 a tunneling dielectric layer formed over a first surface of the substrate;
 a doped conductive layer formed over the tunneling dielectric layer and including a plurality of main body portions and a plurality of first connecting portions;
  wherein each of the plurality of main body portions extends in a first direction, and the plurality of main body portions are arranged at intervals along a second direction perpendicular to the first direction;
  wherein at least one first connecting portion of the plurality of first connecting portions is located between every two adjacent main body portions in the plurality of main body portions in the second direction, and each of the at least one first connecting portion has two opposing sidewalls abutting respective ones of the two adjacent main body portions and connected to the respective ones of the two adjacent main body portions; and
 a plurality of first electrodes respectively corresponding to the plurality of main body portions, wherein each of the plurality of first electrodes extends in the first direction, and is disposed on and electrically connected to a corresponding one of the plurality of main body portions.

2. The solar cell according to claim 1, wherein the plurality of first connecting portions are disposed in a form of an array, the array includes a plurality of columns of first connecting portions disposed at intervals along the second direction, first connecting portions in each column of the plurality of columns of first connecting portions are disposed at intervals along the first direction, there is at least one first electrode in the plurality of first electrodes located between two adjacent columns of first connecting portions.

3. The solar cell according to claim 2, wherein a column of the first connecting portions and an adjacent column of the first connecting portions in the plurality of columns of the first connecting portions are disposed in a stagger manner along the first direction.

4. The solar cell according to claim 2, wherein a respective first connecting portion of a column of first connecting portions is in one-to-one correspondence to a respective first connecting portion of an adjacent column of first connecting portions, and every two adjacent first connecting portions corresponding to each other are disposed in the spaced manner along the second direction.

5. The solar cell according to claim 3, further comprising: a plurality of second electrodes disposed at intervals, wherein each of the plurality of second electrodes extends along the second direction and is electrically connected to the plurality of first electrodes.

6. The solar cell according to claim 5, wherein the plurality of second electrodes are spaced apart from the plurality of first connecting portions; or a projection of a part of the plurality of second electrodes on the substrate is overlapped with a projection of a part of the plurality of first connecting portions on the substrate.

7. The solar cell according to claim 5, wherein the substrate includes a peripheral area and a central area, the peripheral area is defined as a periphery of a second electrode located at an outermost side in the plurality of second electrodes, the central area is defined as an area of the substrate other than the peripheral area, and a distance between every two adjacent first connecting portions located in the peripheral area in the first direction is smaller than a distance between every two adjacent first connecting portions located in the central area in the first direction.

8. The solar cell according to claim 7, wherein in each column of the first connecting portions located in the central area, a distance between every two adjacent first connecting portions in the first direction is constant.

9. The solar cell according to claim 7, wherein, in each column of the first connecting portions located in the central area, the distance between every two adjacent first connecting portions ranges from 0.01 mm to 20 mm, in each column of the first connecting portions located in the peripheral area, a distance between every two adjacent first connecting portions ranges from 0.005 mm to 18 mm.

10. The solar cell according to claim 7, wherein in each column of the first connecting portions, there is at least one first connecting portion located in the peripheral area, and there is at most one first connecting portion located in the central area.

11. The solar cell according to claim 2, further comprising: a plurality of second connecting portions, wherein a respective second connecting portion of the plurality of second connecting portions is located between two adjacent first connecting portions disposed at intervals along the first direction, and is electrically connected to side surfaces of the two adjacent first connecting portions.

12. The solar cell according to claim 11, wherein the respective second connecting portion has a width in the second direction less than a distance between two adjacent first electrodes in the second direction.

13. The solar cell according to claim 1, wherein a top surface of the plurality of first connecting portions is lower than or level with top surfaces of the plurality of main body portions.

14. The solar cell according to claim 13, wherein the top surface of the plurality of first connecting portions has a light trapping structure.

15. The solar cell according to claim 14, wherein the light trapping structure is a recessed structure that is recessed towards the tunneling dielectric layer.

16. The solar cell according to claim 14, wherein the recessed structure has a cross-sectional shape of triangle or rectangle.

17. The solar cell according to claim 1, wherein the doped conductive layer further includes a plurality of third connecting portions, a respective third connecting portion is located between every two adjacent main body portions in the plurality of main body portions and in contact with each of the two adjacent main body portions, a top surface of the plurality of third connecting portions is lower than a top surface of the plurality of main body portions, and the plurality of first connecting portions are located on a part of the top surface of the plurality of third connecting portions.

18. The solar cell according to claim 1, wherein the doped conductive layer is made of at least one of doped amorphous silicon, doped polysilicon, or doped microcrystalline silicon.

19. The solar cell according to claim 1, further comprising: a first passivation layer, one part of the first passivation layer covers the first surface of the substrate, and the other part of the first passivation layer covers a surface of the doped conductive layer away from the tunneling dielectric layer.

20. A photovoltaic module, comprising:
- at least one cell string, wherein each of the at least one cell string is formed by connecting a plurality of solar cells, each of the plurality of solar cells being a solar cell according to claim 1;
- at least one package layer configured to cover a surface of the at least one cell string;
- at least one cover plate configured to cover a surface of the at least one package layer away from the at least one cell string.

* * * * *